US 8,194,445 B2

(12) United States Patent
Sawamura

(10) Patent No.: US 8,194,445 B2
(45) Date of Patent: Jun. 5, 2012

(54) SEMICONDUCTOR STORAGE DEVICE COMPRISING DOT-TYPE CHARGE ACCUMULATION PORTION AND CONTROL GATE, AND METHOD OF MANUFACTURING THE SAME

(75) Inventor: Kenji Sawamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 280 days.

(21) Appl. No.: 12/727,780

(22) Filed: Mar. 19, 2010

(65) Prior Publication Data

US 2011/0069553 A1    Mar. 24, 2011

(30) Foreign Application Priority Data

Sep. 24, 2009   (JP) ................... 2009-219737

(51) Int. Cl.
*G11C 16/04*   (2006.01)
*H01L 29/788*  (2006.01)
*H01L 29/792*  (2006.01)
*H01L 21/336*  (2006.01)

(52) U.S. Cl. .............. 365/185.01; 365/185.17; 257/316; 257/324; 438/257; 438/264

(58) Field of Classification Search .............. 365/185.01
See application file for complete search history.

(56) References Cited

U.S. PATENT DOCUMENTS

| | | | |
|---|---|---|---|
| 6,285,055 B1 * | 9/2001 | Gosain et al. | 257/317 |
| 6,342,716 B1 * | 1/2002 | Morita et al. | 257/315 |
| 6,410,412 B1 * | 6/2002 | Taira et al. | 438/594 |
| 6,413,819 B1 * | 7/2002 | Zafar et al. | 438/257 |
| 6,680,505 B2 * | 1/2004 | Ohba et al. | 257/314 |
| 6,870,765 B2 * | 3/2005 | Fujiwara | 365/185.02 |
| 7,355,238 B2 * | 4/2008 | Takata et al. | 257/314 |
| 7,407,856 B2 * | 8/2008 | Yoo et al. | 438/257 |
| 7,442,989 B2 * | 10/2008 | Kobayashi et al. | 257/325 |
| 7,612,403 B2 * | 11/2009 | Bhattacharyya | 257/317 |
| 7,791,129 B2 * | 9/2010 | Terai | 257/323 |
| 2010/0044775 A1 * | 2/2010 | Sunamura | 257/324 |

FOREIGN PATENT DOCUMENTS

| | | |
|---|---|---|
| JP | 58-200581 | 11/1983 |
| JP | 2001-85546 | 3/2001 |
| JP | 2002-164446 | 6/2002 |
| JP | 2003-78043 | 3/2003 |

(Continued)

OTHER PUBLICATIONS

Notice of Reasons for Rejection, mailed Feb. 7, 2012 for Japanese Patent Application No. 2009-219737.

*Primary Examiner* — Son Mai
(74) *Attorney, Agent, or Firm* — Oblon, Spivak, McClelland, Maier & Neustadt, L.L.P.

(57) ABSTRACT

A semiconductor memory device includes a first insulation film, Charge accumulation portions, a second insulation film, and a control gate. The first insulation film is located on an active area (AA). The charge accumulation portions comprise minute crystals arranged on the first insulation film. A density of the charge accumulation portions at an end portion in an AA width direction of the first insulation film is higher than a density of the charge accumulation portions at a central potion in the AA width direction. The second insulation film is located on the first insulation film so as to coat the charge accumulation portions. The control gate is located on the second insulation film.

20 Claims, 8 Drawing Sheets

FOREIGN PATENT DOCUMENTS

| | | |
|---|---|---|
| JP | 2006-120663 | 5/2006 |
| JP | 2007-324480 | 12/2007 |
| JP | 2008-131030 | 6/2008 |
| JP | 2009-81313 | 4/2009 |
| JP | 2009-81316 | 4/2009 |
| JP | 2009-88518 | 4/2009 |
| JP | 2009-302310 | 12/2009 |
| JP | 2010-98054 | 4/2010 |

\* cited by examiner

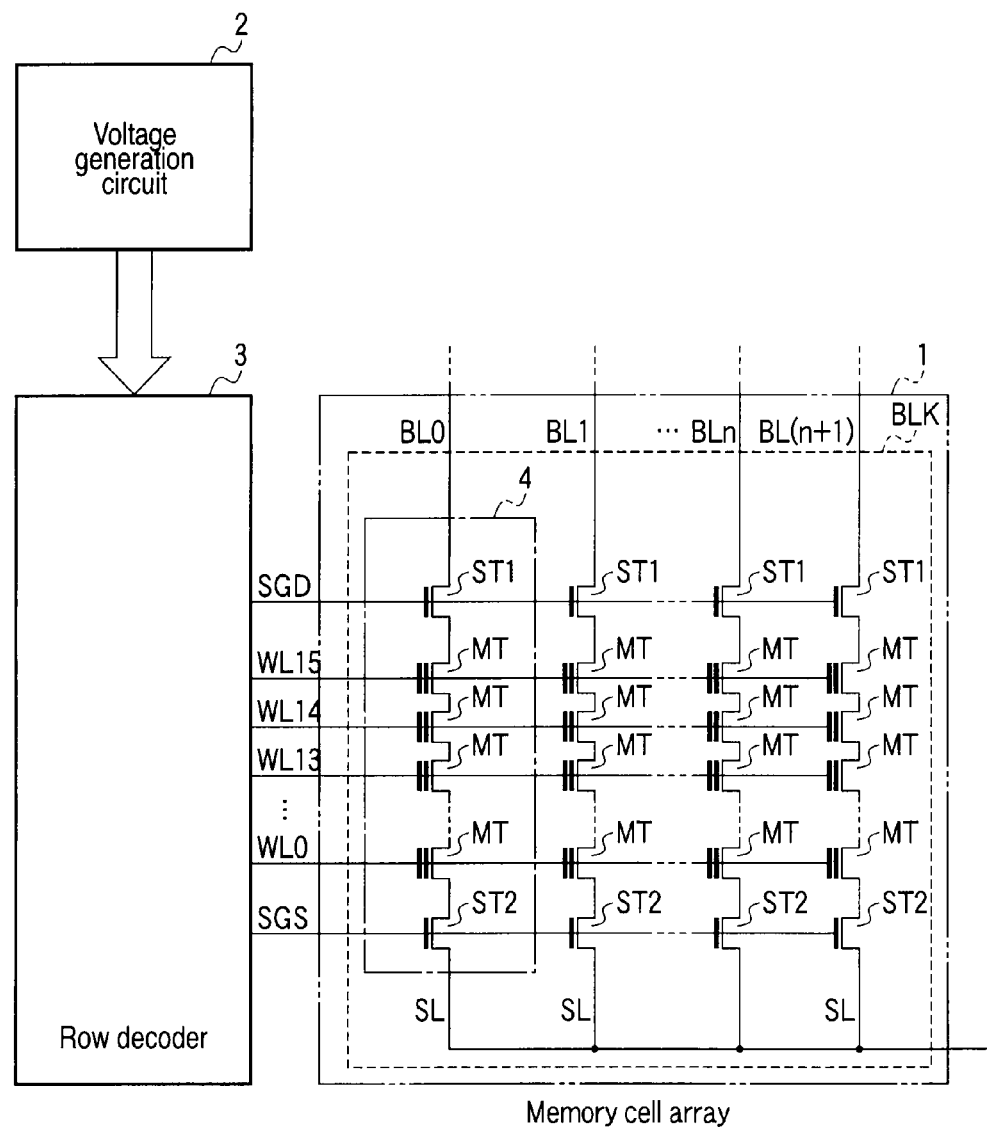
F I G. 1

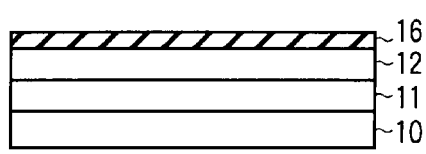
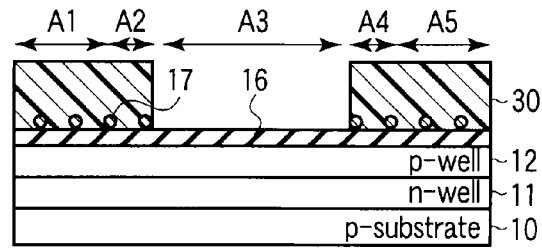
FIG. 8A  FIG. 8B
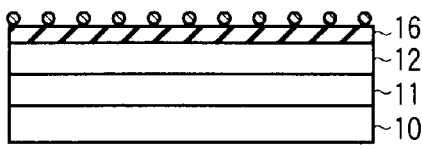
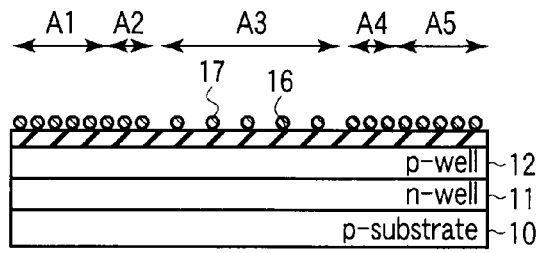
FIG. 9A  FIG. 9B
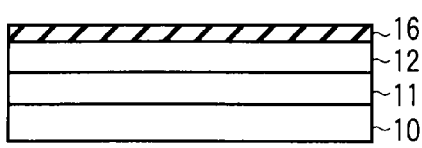
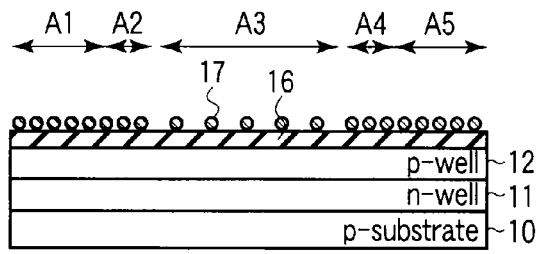
FIG. 10A  FIG. 10B

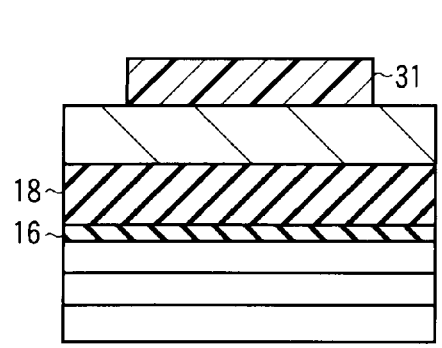
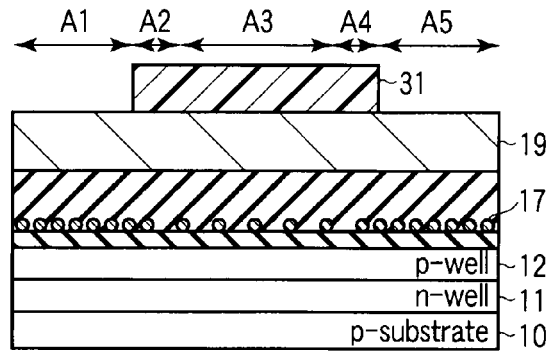
FIG. 11A        FIG. 11B
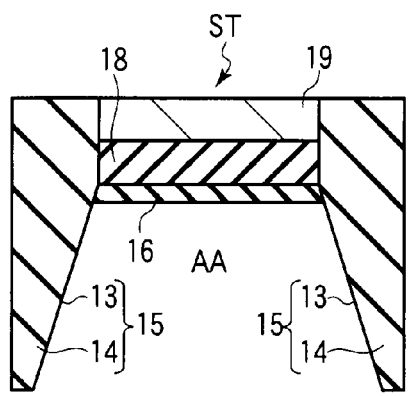
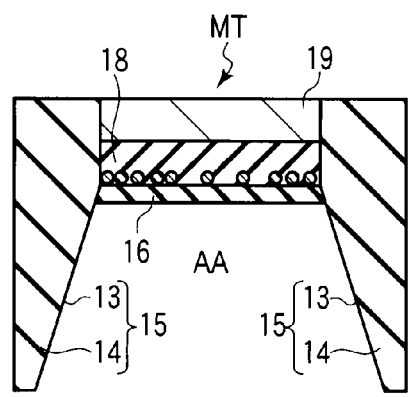
FIG. 12A        FIG. 12B

SEMICONDUCTOR STORAGE DEVICE COMPRISING DOT-TYPE CHARGE ACCUMULATION PORTION AND CONTROL GATE, AND METHOD OF MANUFACTURING THE SAME

CROSS-REFERENCE TO RELATED APPLICATIONS

This application is based upon and claims the benefit of priority from prior Japanese Patent Application No. 2009-219737, filed Sep. 24, 2009, the entire contents of which are incorporated herein by reference.

BACKGROUND OF THE INVENTION

1. Field of the Invention

The present invention relates to a semiconductor memory device, and a method of manufacturing the same.

2. Description of the Related Art

A MONOS memory cell transistor is manufactured by sequentially forming a charge accumulation layer configured to accumulate charges sequentially formed via an insulation film on an active area, a block layer configured to prevent the charges accumulated in the charge accumulation layer from flowing, and a control gate. A memory transistor employing a dot-type charge accumulation portion formed of metal, for example, instead of the charge accumulation layer in the MONOS memory cell transistor, is known, as disclosed in Jpn. Pat. Appln. KOKAI Publication No. 2006-120663. The dot-type charge accumulation portion is formed so as to be evenly arranged on the gate oxidation film.

BRIEF SUMMARY OF THE INVENTION

A semiconductor memory device according to an aspect of the present invention includes:

a first insulation film located on an active area (AA);

a plurality of charge accumulation portions comprising minute crystals arranged on the first insulation film, a density of the charge accumulation portions at an end portion in an AA width direction of the first insulation film being higher than a density of the charge accumulation portions at a central potion in the AA width direction;

a second insulation film located on the first insulation film so as to coat the charge accumulation portions; and a control gate located on the second insulation film.

A method of manufacturing a semiconductor memory device according to an aspect of the present invention includes:

forming a first gate insulation film on a semiconductor substrate;

arranging a plurality of minute crystals at a predetermined density on the first gate insulation film;

removing only minute crystals arranged at a central portion in an active area (AA) width direction in a region in which an active area is to be formed on the first gate insulation film;

arranging the minute crystals at a predetermined density again on the first gate insulation film;

sequentially forming a first insulation film and a first conductive film on the first gate insulation film so as to coat the plurality of minute crystals;

forming an active area by patterning the first conductive film, the first insulation film, the first gate insulation film, and the semiconductor substrate;

forming a first element separation region by embedding an element separation insulation film;

forming a first gate electrode layer on the element separation insulation film and the first conductive film; and forming a gate electrode by patterning the first gate electrode layer, the first conductive layer, the first insulation layer, and the first gate insulation film.

BRIEF DESCRIPTION OF THE SEVERAL VIEWS OF THE DRAWINGS

FIG. 1 is a block diagram illustrating a NAND flash memory according to an embodiment of the present invention;

FIGS. 6A, 7A, 8A, 9A, 10A, 11A and 12A are cross-sectional views illustrating first to seventh manufacturing steps of a memory cell transistor according to an embodiment of the present invention;

FIGS. 6B, 7B, 8B, 9B, 10B, 11B and 12B are cross-sectional views illustrating first to seventh manufacturing steps of a select transistor according to an embodiment of the present invention;

DETAILED DESCRIPTION OF THE INVENTION

Figure 2:
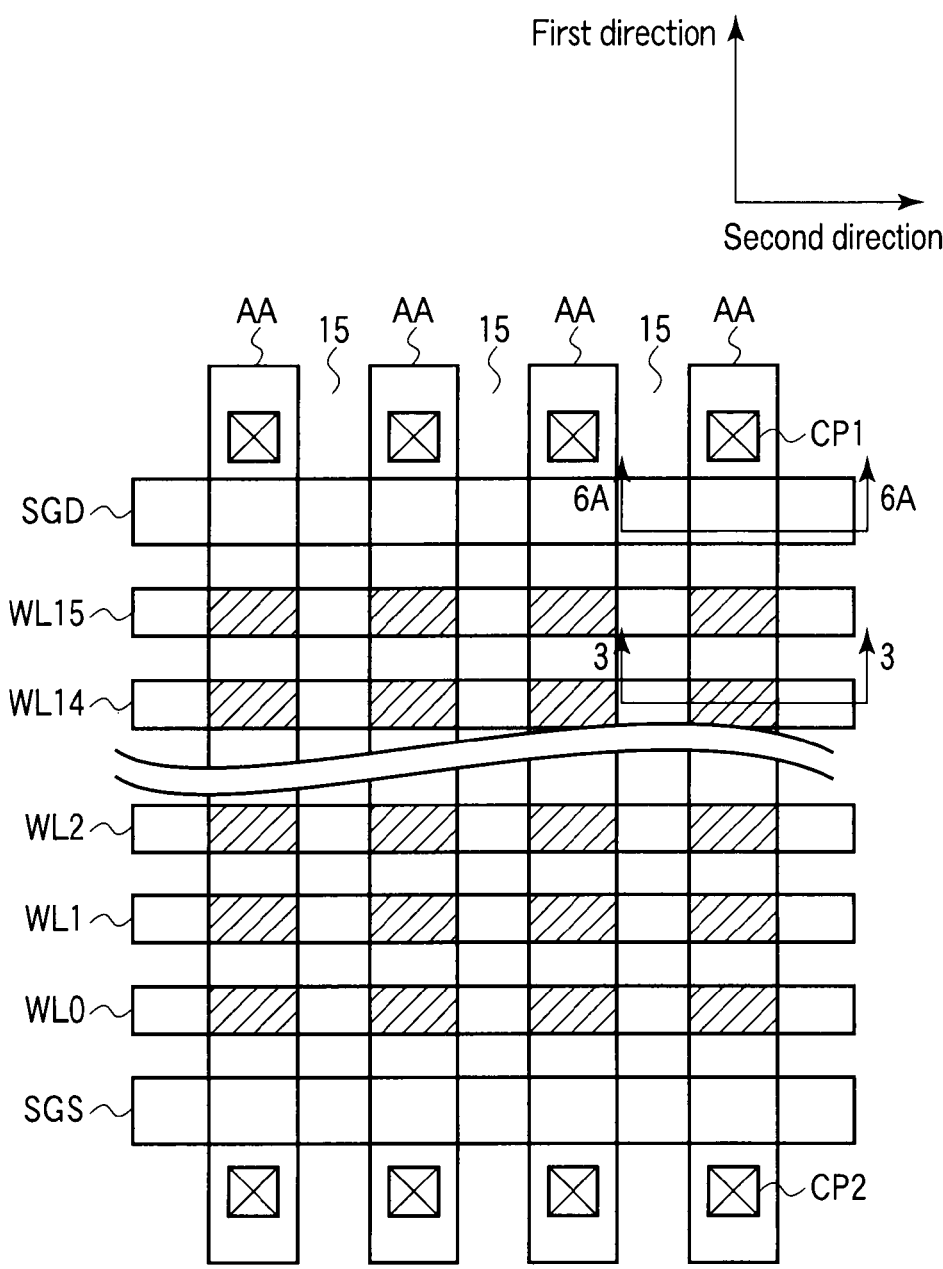
FIG. 2 is a plan view illustrating a memory cell included in the NAND flash memory according to an embodiment of the present invention.

Hereinafter, an embodiment of the present invention will be described with reference to the accompanying drawings. In the descriptions that follow, the common structural elements will be denoted by the common reference numerals throughout the drawings.

<Exemplary Overall Configuration>

As shown in FIG. 1, a NAND flash memory comprises a memory cell array 1, a voltage generation circuit 2, and a row decoder 3. Descriptions will be made with regard to the memory cell array 1.

<Memory Cell Array 1>

As shown, the memory cell array 1 includes a plurality of blocks BLK. Each of the blocks BLK includes a plurality of NAND cells 4, in which non-volatile memory cells are connected in series. Each of the NAND cells 4 includes 16 memory cell transistors MT, for example, and select transistors ST1, ST2. The memory cell transistor MT has a MONOS structure including a dot-type charge accumulation portion (hereinafter referred to as dot charge accumulation portion) formed of metal or silicon, for example, via a gate insulation film on a semiconductor substrate, an insulation film (hereinafter referred to as block layer) formed so as to coat the charge accumulation portion, and a control gate electrode formed on the block layer. The number of the memory cell transistors MT is not limited to 16, and may be 8, 32, 64, 128, or 256, for example. Adjacent memory cell transistors MT share an impurity diffusion layer (source and drain). The memory cell transistor MT is provided between select transistors ST1 and ST2, such that its current path is connected in series. A drain region on one end side of the memory cell transistor MT connected in series is connected to a source region of select transistor ST1, and a source region on the other end side is connected to a drain region of select transistor ST2.

Control gate electrodes of the memory cell transistors MT in the same line are commonly connected to one of word lines WL1-WL15, and gate electrodes of select transistors ST1, ST2 of the memory cells in the same line are commonly connected to select gate lines SGD, SGS, respectively. For simplification of description, in the descriptions that follow, the word lines WL0-WL15 may be simply referred to as word lines WL, when they are not distinguished from one another. In the memory cell array 1, drains of select transistors ST1 in the same row are commonly connected to one of bit lines BL0-BL(n+1) (where n is a natural number). Hereinafter, the bit lines BL0-BL(n+1) will also be collectively referred to as bit lines BL, when they are not distinguished from one another. Sources of the select transistor are commonly connected to a source line SL.

FIG. 1 shows only a line of NAND cell 4. In the memory cell array 1, however, a plurality of lines of NAND cells 4 may be provided. In this case, the NAND cells 4 in the same row will be connected to the same bit line BL. Further, data is collectively written into a plurality of memory cell transistors MT connected to the same word line WL. This unit will be referred to as a page. Data in the NAND cells 4 in the same line is collectively erased. This unit will be referred to as a memory block.

<Voltage Generation circuit 2>

The voltage generation circuit 2 generates a predetermined voltage and supplies the row decoder 3 with the generated predetermined voltage. The predetermined voltage generated by the voltage generation circuit 2 assumes a magnitude that changes a threshold level of the memory cell transistor MT by injecting charges into the charge accumulation portion, for example.

<Row Decoder>

The row decoder 3 selects a row direction of the memory cell array 1. That is, the row decoder 3 selects a word line WL, and applies the predetermined voltage generated by the voltage generation circuit 2 to the selected word line WL.

<Planar Configuration of Memory Cell Array 1>

Next, the planar configuration of the memory cell array 1 with the above-described configuration will be described, with reference to FIG. 2.

As shown in FIG. 2, a plurality of active areas AA, each having a striped shape along a first direction, are provided in the p-type semiconductor substrate 10 (not shown), along a second direction that crosses the first direction. An element separation region 15 is formed between adjacent active areas AA, and the active areas AA are electrically separated by the element separation region 15. On the p-type semiconductor substrate 10, the word lines WL and the select gate lines SGD, SGS are formed in the shape of stripes along the second direction, so as to stride over the active areas AA. In the regions (indicated by the diagonal lines) where the word lines WL and the active areas AA cross one another, dot-type charge accumulation portions 17, which will be described later, are provided. Further, in the regions (indicated by the diagonal lines) where the word lines WL and the active areas AA cross one another, memory cell transistors MT are provided, and channels are provided, as necessary, in the vicinity of the surface of the active areas AA. Further, select transistors ST1, ST2 are provided in the regions where the select gate lines SGD, SGS, respectively, and the active areas AA cross one another. In the active areas AA between the word lines WL, between the select gate lines, and between the word lines WL and the select gate lines that are adjacent to one another in the first direction, an impurity diffusion layer, which is to be a source region or a drain region of the memory cell transistor MT, and select transistors ST1, ST2, is formed.

The impurity diffusion layer formed in the active areas AA between the select gate lines SGD adjacent to one another in the first direction functions as a drain region of select transistor ST1. A contact plug CP1 is formed on the drain region. Contact plug CP1 is connected to a stripe-shaped bit line BL (not shown) provided along the first direction. Further, the impurity diffusion layer formed in the active area AA between the select gate lines SGS adjacent to one another in the first direction functions as a source region of select transistor ST2. A contact plug CP2 is formed on the source region. Contact plug CP2 is connected to a source line SL, not shown.

<Exemplary Cross-Sectional Configuration>

Figure 3:
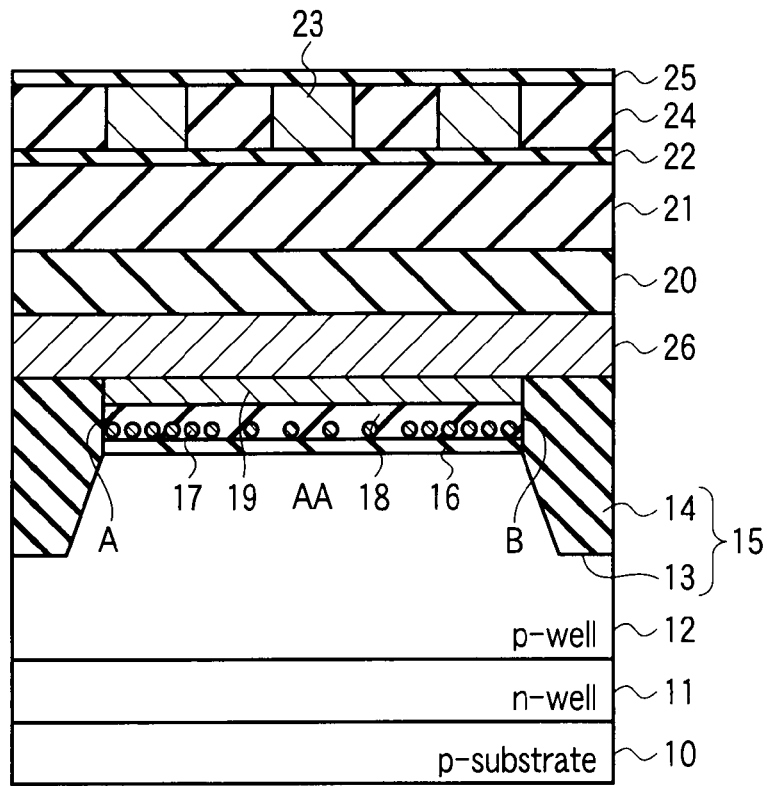
FIG. 3 is a cross-sectional view along line 3-3 of the memory cell array included in the NAND flash memory, according to an embodiment of the present invention.

Next, a cross-sectional configuration of the memory cell array 1 will be described, with reference to FIG. 3. FIG. 3 illustrates a cross-sectional configuration of the NAND cell 4 cut along line 3-3 of FIG. 2. Hereinafter, the direction along line 3-3 of FIG. 3 may also be referred to as a gate width direction or AA width direction, and the direction perpendicular to line 3-3 may also be referred to as a gate length direction or AA length direction.

As shown in FIG. 3, an n-type well region 11 and a p-type well region 12 are formed on the surface region of the p-type semiconductor substrate 10 and on the n-type well region 11, respectively. Further, a plurality of grooves 13 are formed along the second direction in the p-type well region 12. An insulation film 14 formed using a silicon oxidation film, for example, is embedded in the groove 13. An element separation region 15 is formed by the groove 13 and the insulation layer 14. The region between adjacent element separation regions 15 becomes an active area AA. The adjacent active areas AA are separated by the element separation region 15. A gate oxidation film 16, formed of a silicon oxidation film, for example, is formed on the active area AA, and a gate electrode of the memory cell transistor MT is formed on the gate oxidation film 16. The gate oxidation film 16 in the memory cell transistor MT functions as a tunnel film which electrons tunnel.

The gate electrode of the memory cell transistor MT has a MONOS structure including a dot-type charge accumulation portion 17. That is, metal or silicon is formed through CVD, for example, on the entire surface of the gate insulation film 16, so as to have a diameter of 1-3 nm. That is, minute crystals of the metal are formed on the entire surface of the gate insulation film 16, without being stacked on one another. Similarly, when silicon is formed, minute crystals of the silicon are formed on the entire surface of the gate insulation film 16, without being stacked on one another. Further, an insulation film 18 is formed so as to coat the dot-type charge accumulation portions 17. A polycrystalline silicon layer 19 is formed on the insulation film 18. The upper surface of the insulation film 14 and the upper surface of the polycrystalline silicon layer 19 are on the same level. The dot-type charge accumulation portion 17 has a function of accumulating electrons that have been induced on the surface of the active area AA and tunneled through the gate insulation film 16. The dot-type charge accumulation portions 17 are arranged such that their density become higher as they are closer to the both ends (A and B shown in FIG. 3, where A and B are interfaces where the insulation film 18 contact the element separation region 15) of the gate oxidation film 16. In other words, the dot-type charge accumulation portions 17 are arranged at end portions of the gate insulation film 16 along its AA width direction so as to have high densities, compared to those arranged at the center of the gate insulation film 16. More specifically, the density of the dot-type charge accumulation portion 17 arranged in a region at an end portion of the gate insulation film 16 is higher than at least the density of the dot-type charge accumulation portion 17 arranged in a region at a central portion of the gate insulation film 16. Further, the dot-type charge accumulation portions 17 are formed (arranged) so as to keep a predetermined distance from one another. That is, since the dot-type charge accumulation portions 17 have higher densities as they are closer to the end portions, the number of the dot-type charge accumulation portions 7 increases in regions closer to the end portions. Distribution of the dot-type charge accumulation portion 17 has been described with reference to the cross-section along line 3-3 (second direction) of FIG. 2 as way of example. The distribution of the dot-type charge accumulation portions 17 holds for any cross-sections along the second direction, as long as the cross-section is in the regions (indicated by the diagonal lines) in which the channel of the memory cell transistor MT is formed in FIG. 2. In other words, distribution of the dot-type charge accumulation portions 17 in a cross-section along the second direction holds continuously in the first direction, except for the region where the impurity distribution layer is formed.

A polycrystalline silicon layer 26 is formed on the element separation region 15 and the polycrystalline silicon layer 26. The bottom surface of the polycrystalline silicon layer 26 and the upper surfaces of the element separation region 15 and the polycrystalline silicon layer 19 are formed on the same level. The insulation film 18 functions as a block layer configured to confine electrons to the dot-type charge accumulation portions 17. Further, the polycrystalline silicon layers 19, 26 function as control gates (word lines). Hereinafter, the insulation film 18 and the polycrystalline silicon layers 19, 26 may also be referred to as a block layer 18 and the control gate 26, respectively. In order to lower the resistance of the word line, an upper portion or the entire portion of the polycrystalline silicon layer 26 may be silicided. The block layer 18 is separated by the memory cell transistors MT, and the control gate 26 is commonly connected to adjacent memory cell transistors MT in the word line direction. That is, the control gate 26 of each of the memory cell transistors MT is commonly connected to adjacent active areas AA, so as to straddle over adjacent element separation regions 15.

Further, an $n^+$-type impurity diffusion layer (not shown) is formed on the surface of the p-type semiconductor substrate 10, which is positioned between the gate electrodes. The $n^+$-type impurity diffusion layer is commonly used by adjacent transistors, and functions as a source (S) or a drain (D). The region (region directly below the gate electrode) between a source and a drain that are adjacent to each other functions as a channel region, which is to be a region where electrons move. The memory cell transistor MT is formed by the gate electrode, the $n^+$-type impurity diffusion layer, and the channel region.

Further, an interlayer insulation layer 20 is formed on the p-type semiconductor substrate 10, so as to coat the memory cell transistor MT. An interlayer insulation layer 21 is formed of $SiO_2$, for example, on the interlayer insulation film 20. An insulation film 22 is formed on the interlayer insulation film 21. The insulation film 22 is formed using a material having a higher dielectric constant than the interlayer insulation film 21, such as SiN. A metal wiring layer 23 is formed on the insulation film 22. The metal wiring layer 23 functions as a bit line BL. An interlayer insulation layer 24 is formed on the insulation film 22, so as to embed the region between adjacent bit lines BL. The interlayer insulation film 24 is formed using a material having a lower dielectric constant than the insulation film 21, such as $SiO_2$. An insulation film 25 is formed on the metal wiring layer 23, and the interlayer insulation film 24. The descriptions have been given above with regard to the memory cell transistor MT, but select transistor ST in the NAND cell 4 has a structure of eliminating the dot-type charge accumulation portions 17 from the memory cell transistor MT. That is, the insulation film 18 and the polycrystalline silicon layers 19, 26 are sequentially formed on the active area AA via the gate insulation film 16.

Figure 4:
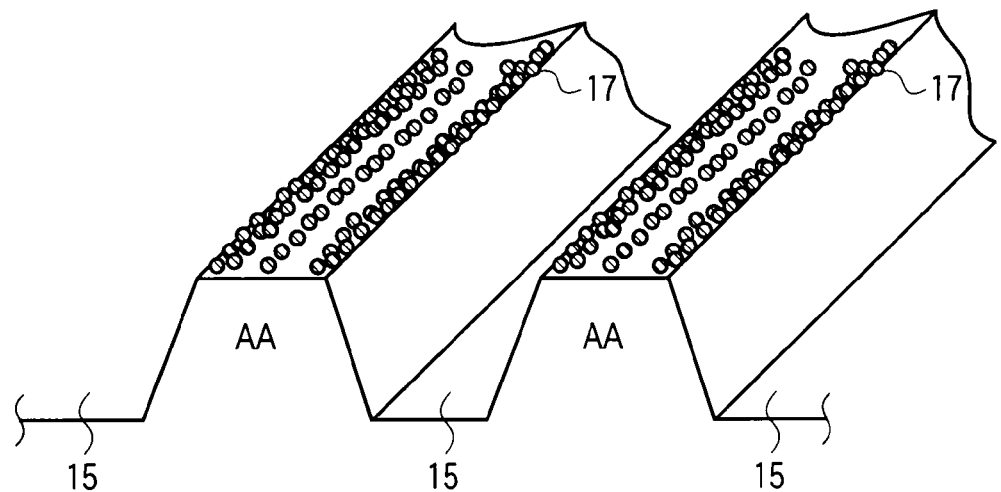
FIG. 4 is a perspective view of the dot-type charge accumulation portion according to an embodiment of the present invention.

FIG. 4 is a perspective view of the active area AA, in which the above-described memory cell transistor MT is formed. FIG. 4 particularly illustrates distribution of the dot-type charge accumulation portions 17. For simplification of description, the gate insulation film 16, the block layer 18, and the control gate 19 are omitted.

As shown, the dot-type charge accumulation portions 17, formed of metal or silicon, for example, are distributed on the gate insulation film 16, which is formed on the active area AA electrically separated by the element separation region 15. As described above with reference to FIG. 3, the dot-type charge accumulation portions 17 are distributed such that they have higher densities as they are closer to the end portions in the width direction of the active area AA on the gate insulation film 16. FIGS. 5A-5D illustrate graphs indicating the distributions. FIGS. 5A-5D illustrate distribution of the densities of the dot-type charge accumulation portion 17 formed on the gate insulation film 16. The ordinate represents the density of the dot-type charge accumulation portion 17, and the abscissa represents the position of the active area AA. Positions A and B on the abscissa correspond to the interfaces shown in FIG. 3, where the insulation film 18 and the element separation region 15 contact.

Figure 5A:
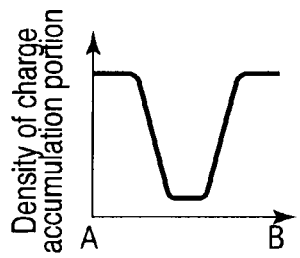
FIGS. 5A, 5B, 5C and 5D are distribution charts of the dot-type charge accumulation portion according to an embodiment of the present invention.
Figure 5B:
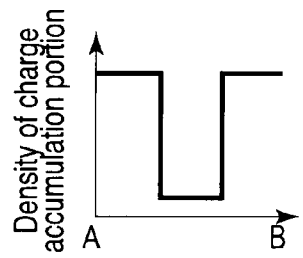
Figure 5C:
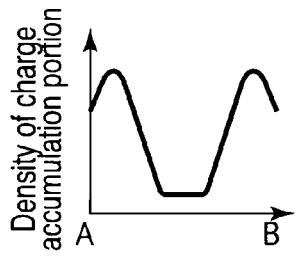
Figure 5D:
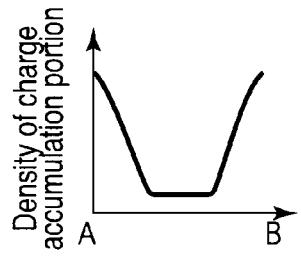

As shown, the dot-type charge accumulation portion 17 at the end portions in its width direction has a high density, compared to the central portion of the active area AA in its width direction. Further, as shown in FIGS. 5A, 5B and 5D, the dot-type charge accumulation portion 17 has the highest density in portions contacting the element separation region 15. Further, as shown in FIGS. 5A-5D, the dot-type charge accumulation portion 17 has the lowest density in the central portion of the gate insulation film 16 in the gate width direction. That is, as shown in FIGS. 5A-5D, the dot-type charge accumulation portion 17 should have a high density in a region in the proximity of, or adjacent to the element separation region 15.

The density of the dot-type charge accumulation portions 17 arranged at end portions have been described above as having higher densities than the densities of the dot-type charge accumulation portions 17 arranged at the central portions of the gate insulation film 16 in its gate width direction. The dot-type charge accumulation portion 17, however, may be formed in any distribution shown in FIGS. 5A-5D, as long as the density at the end portions is higher than the density at the central portion.

<Manufacturing Method>

Next, the method of manufacturing the memory cell transistor MT and select transistor ST will be described, with reference to FIGS. 6A-12A and FIGS. 6B-12B. FIGS. 6A-12A illustrate cross-sections of the region where the memory cell transistor MT is to be formed, along direction 3-3 of FIG. 3. FIGS. 6B-12B illustrate cross-sections of the region where the select transistor ST is to be formed, along the direction 6A-6A of FIG. 2.

Figure 6A:
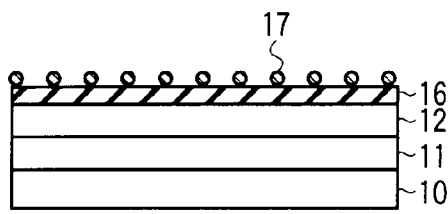
Figure 6B:
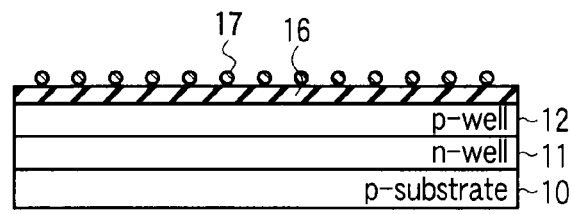

First, as shown in FIGS. 6A and 6B, an n-type well region 11 is formed by injecting phosphorous ions at a predetermined acceleration voltage, for example, into the surface of the regions where the select transistor ST and the memory transistor MT are formed. Further, a p-type well region 12 is formed by injecting boron ions at a predetermined acceleration voltage into the surface of the p-type semiconductor substrate 10. After that, minute crystals formed of metal or silicon having a diameter of 1-3 nm, which function as the dot-type charge accumulation portion 17, are formed using CVD, so as to keep a predetermined interval from one another.

Figure 7A:
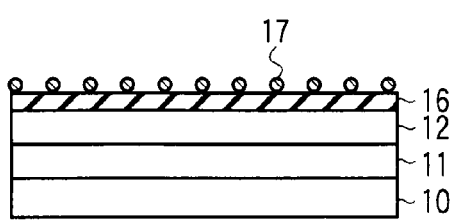
Figure 7B:
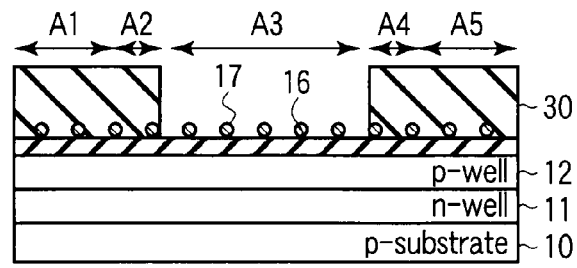

Next, as shown in FIG. 7B, a photoresist film 30 is formed, so as to make an opening in the region where the memory cell transistor MT is to be formed, and the central portion A (which may be also referred to as region A3) along the AA width direction in the active area AA and the select transistor ST are also to be formed. That is, end portions (which will be referred to as regions A2 and A4) of the active area AA of the region where the memory cell transistor MT is to be formed in the AA width direction and element separation regions (which will be referred to as regions A1 and A5) are coated with the photoresist film 30.

In FIGS. 7B-11B, the central portion A3 in the AA width direction of the active area AA indicates the central portion in the AA width direction of the active area AA in the surface (interface between the p-well 12 and the gate insulation film 16) of the p-type semiconductor substrate 10. The end portions (regions A2 and A4) in the AA width direction in the active area AA refer to regions in the vicinity of the interface between active area AA and the element separation region 15 at ends in the AA width direction of the active area AA on the surface of the p-type semiconductor substrate 10. The element separation regions (regions A1 and A5) refer to element separation regions having the same height as that of the top surface of the p-type semiconductor substrate 10.

After that, as shown in FIGS. 8A and 8B, the dot-type charge accumulation portions 17, formed on region A3 in the region where the memory cell transistor MT is to be formed, and the region where the select transistor ST is to be formed, is removed through wet etching, for example.

After that, as shown in FIG. 9B, the photoresist film 30 is removed from regions A1, A2, A4, and A5. After that, as shown in FIGS. 9A and 9B, the dot-type charge accumulation portions 17 are formed again on the gate insulation film 16, using CVD, for example. In this case, the dot-type charge accumulation portions 17 are formed based on the conditions same as those described above with reference to FIGS. 6A and 6B. That is, minute crystals of metal or silicon are formed, so as to keep an even interval from one another. In other words, the dot-type charge accumulation portions 17 are formed on the gate insulation film 16, so as to have similar densities as those described with regard to the formation of the dot-type charge accumulation portions 17 with reference to FIGS. 6A and 6B. Thereby, the dot-type charge accumulation portions 17 have higher densities in regions A1, A2, A4, and A5. That is, the dot-type charge accumulation portions 17 formed in region A3 have lower densities than the dot-type charge accumulation portions 17 formed in regions A1, A2, A4, and A5. More specifically, as described above, the dot-type charge accumulation portions 17 arranged in regions A1, A2, A4, and A5 have higher densities at least than the dot-type charge accumulation portions 17 arranged in region A3.

Next, a photoresist film is formed in the region where the memory cell transistor is to be formed, so as to coat the dot-type charge accumulation portions 17. Following that, the dot-type charge accumulation portions 17 in the region where the select transistor ST is to be formed is removed through wet etching, for example. By removing the photoresist film in the region where the memory cell transistor is to be formed, the configurations of FIGS. 10A and 10B are obtained.

As shown in FIGS. 11A and 11B, an insulation film 18 is formed on the entire surface of the gate insulation film 16, and a polycrystalline silicon layer 19 is formed on the insulation film 18. Further, a photoresist film 31 is formed in the region which is on the polycrystalline silicon layer 19 in the regions where the select transistor ST and the memory cell transistor MT are to be formed and in which the active area AA is to be formed, that is, in regions A2, A3, and A4. That is, the region in which the photoresist film 31 is not formed is a region where the element separation region 15 is to be formed.

As shown in FIGS. 12A and 12B, the polycrystalline silicon layer 19, the insulation film 18, and the p-type semiconductor substrate 10 are patterned from above in the region where the photoresist film 31 is not formed, and the photoresist film 31 is removed. After that, an insulation film 14 is embedded in the groove 13, and then the insulation film 14 is planarized by chemical mechanical polishing (CMP), so as to obtain an STI structure as shown in FIGS. 12A and 12B. After that, a polycrystalline silicon layer 26 is deposited, and the gate electrode is patterned. Thereby, a region in which an impurity diffusion layer (not shown) is to be formed is exposed on a top surface of the p-type semiconductor substrate 10. By forming an impurity diffusion layer on the top surface of the active area AA using the gate electrode as a mask, the memory cell transistor MT and the select transistor are formed. By forming insulation layers 20, 21, 22, for example, on the polycrystalline silicon layer 26 using a publicly-known approach, the structure shown in FIG. 3 is obtained.

<Advantageous Effect>

The semiconductor memory device and the method of manufacturing the same according to the present embodiment obtain advantageous effects (1) and (2) as will be described below.

(1) Improvement in Operation Reliability

In the semiconductor memory device and the method of manufacturing the same according to the present embodiment, the dot-type charge accumulation portions 17 are formed on the gate insulation film 16 with a predetermined distribution. Advantageous effects obtained from this distribution will be described by comparing them with those obtained from a semiconductor memory device comprising the conventional dot-type charge accumulation portion. The same elements will be referred to by the same reference numerals in the conventional semiconductor memory device, too.

The conventional NAND-type flash memory adopts a structure of evenly arranging the dot-type charge accumulation portions 17 on the gate insulation film 16. In this case, a predetermined voltage is applied to the control gate 19 when data is written, for example. An electric field according to the applied voltage is radiated toward the active area AA from the control gate 19. In this case, the electric field is distributed so as to concentrate on the end portions of the active area AA, compared to the central portion of the active area AA. That is, when the dot-type charge accumulation portions 17 are evenly formed, the electric field cannot completely terminate at the dot-type charge accumulation portions 17 formed at end portions, compared to the central portion of the active area AA, and thereby the electric field is applied to the end portions of the active area AA. That is, a channel is formed at end portions of the active area AA earlier and at a lower voltage than the central portion (This will be referred to as Problem 1).

There is also a problem as will be described below (This will be referred to as Problem 2). The element separation region 15, which electrically separates the active area AA, often includes carbon (C) or nitride (N), for example, in the process of forming the memory cell transistor MT. Hereinafter, they will be referred to as fixed charges (acceptors). The fixed charges such as carbon and the nitride are positively charged and function as ions. The carbon and the nitride have the characteristics of tending to gather at the interface between the element separation region 15 and the active area AA. Since the fixed charges are positively charged, the electric field concentrates on the channel in the active area AA generated in Problem 1. That is, the electric field from the control gate 19 and the electric field from the fixed charges concentrate on the end portions of the active area AA.

Figure 13:
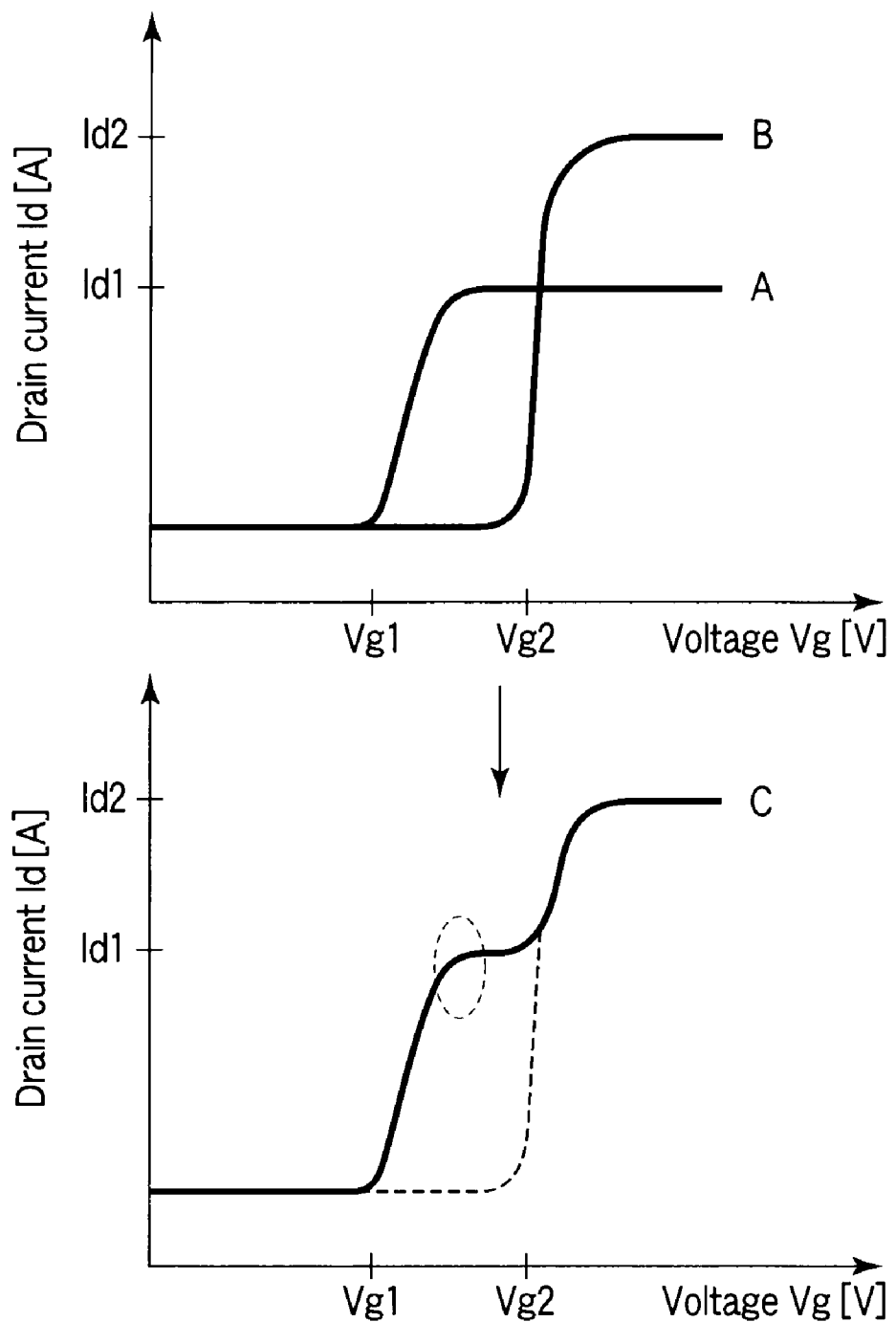
FIG. 13 is a graph illustrating current-voltage characteristics of the memory cell transistor according to an embodiment of the present invention.

Problems 1 and 2 cause a state in which a leakage current is easily generated, as shown in FIG. 13. FIG. 13 is a graph indicating the relationship between the voltage applied to the control gate 19 at the time of writing data, for example, and the drain current flowing through the channel region of the active area AA. The ordinate represents drain current Id, and the abscissa represents voltage Vg applied to the control gate 19. Further, FIG. 13 shows lines A, B, C. Line A indicates drain current Id flowing through the end portions (regions A1 and A2 in FIG. 7) of the active area AA, and line B indicates drain current Id flowing through the central portion (region A3 in FIG. 7) of the active area AA. Line C indicates current-voltage characteristics, in which lines A and B are mixed. That is, line C indicates drain current Id flowing through the entire channel region of the memory cell transistor MT.

As shown by line A, when voltage Vg applied to the control gate 19 is increased to Vg1, drain current Id starts to increase to Id1. Further, as shown by line B, when voltage Vg applied to the control gate 19 reaches Vg2, drain current Id also starts to increase to Id2 in the central portion of the active area AA. As shown by line C, the drain current Id reaches a saturated area as it draws a stepped line, with respect to voltage Vg applied to the gate electrode in the region surrounded by a circle. That is, as shown by line C, conventionally, a leakage current flows even at a low voltage, and since an on/off ratio cannot be maintained, malfunctions occur as the entire semiconductor memory device.

On the other hand, according to the semiconductor memory device and the method of manufacturing the same according to the present embodiment, Problems 1 and 2 can be solved. As described above, in the MONOS structure according to the present embodiment, the dot-type charge accumulation portions 17 have higher densities as they are closer to the end portions of the active area AA. In other words, the dot-type charge accumulation portions 17 are formed so as to have high densities at end portions, compared to the central portion of the active area AA. Accordingly, when a voltage is applied to the control gate 19, even if the electric field radiated from the control gate 19 toward the active area AA concentrates on the end portions of the active area AA, the dot-type charge accumulation portions 17 of the number capable of terminating the electric field radiated from the control gate 19 exist at the end portions. Therefore, even if a low voltage is applied to the control gate 19, a channel is not formed in the end portions of the active area AA, and a leakage current is prevented from flowing.

Further, the electric field generated from the fixed charges (positive charges shown in FIG. 14) concentrates on the dot-type charge accumulation portion 17 formed so as to have high densities, compared to the end portions of the active area AA. Thereby, a leakage current is prevented from flowing in the end portions of the active area AA, and thereby operation reliability can be improved.

Figure 14:
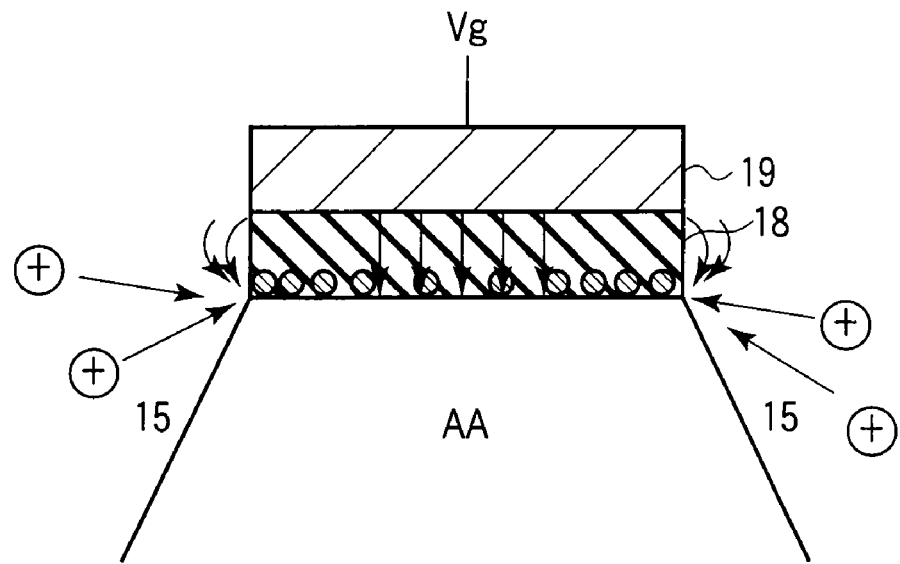
FIG. 14 illustrates an electric field distribution of a semiconductor memory device according to an embodiment of the present invention.

The above-described state is shown in FIG. 14. FIG. 14 shows a state of the electric field radiated from the control gate 19 when a voltage is applied to the control gate 19 in FIG. 12. As shown, the electric field radiated from the control gate 19 travels toward the dot-type charge accumulation portions 17. In particular, the electric field detours around toward the dot-type charge accumulation portions 17 at the end portions, compared to the central portions. Accordingly, the degree of the electric field, i.e., the number of electric fields applied to the central portion and the end portions of the active area AA are almost even. Accordingly, a leakage current does not flow on the top surface of the active area AA, and a channel is generated by applying a voltage Vg3, for example, and drain current Id3 flows through the memory cell transistor MT.

Figure 15:
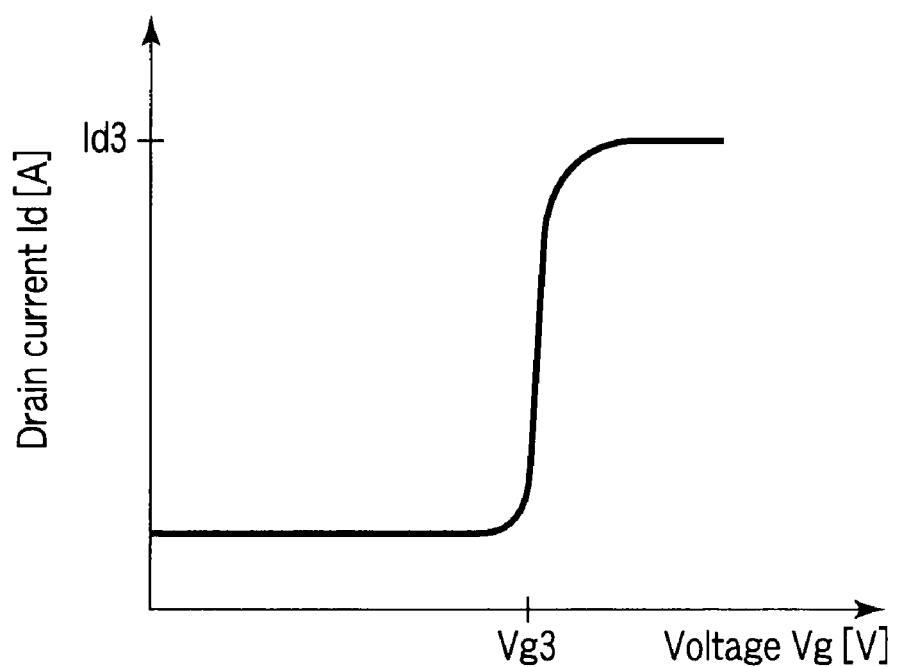
FIG. 15 is a graph illustrating current-voltage characteristics of the memory cell transistor according to an embodiment of the present invention.

The above-described state is shown in FIG. 15. FIG. 15 is a graph of the drain current Id that flows when voltage Vg is applied to the control gate 19 of the memory cell transistor MT. As shown, when voltage Vg applied to the control gate 19 is increased and voltage Vg3 is applied, drain current Id starts to increase to Id3, and then reaches saturation. That is, in the semiconductor memory device and the method of manufacturing the same according to the present embodiment, the leakage current shown by line A does not flow in regions A1 and A2. That is, since drain current Id does not follow a stepped line as indicated by line C, the on/off ratio of the memory cell transistor MT can be maintained, and thereby operation reliability is improved. Voltage Vg3 may be equal to voltage Vg2, and drain current Id3 may be equal to drain current Id2.

(2) Improvement in Operation Reliability

In the semiconductor memory device and the method of manufacturing the same according to the present embodiment, the dot-type charge accumulation portions 17 do not exist on the gate insulation film 16 of the select transistor ST. That is, the threshold of the select transistor ST is kept constant.

Assume that a NAND flash memory requires that a select transistor ST be connected to a selected bit line BL to be turned on at a predetermined voltage (4 V, for example) when data is written or read, for example.

When the dot-type charge accumulation portions 17 are arranged on the gate oxidation film 16, however, a voltage is applied to the control gate 19, and electrons tunnel from the channel region and accumulated in the dot-type charge accumulation portions 17. Thereby, the threshold of the select transistor ST increases. This may cause a problem that the select transistor ST is not turned on even at a predetermined voltage (4 V, for example). That is, a problem is caused that the NAND cell 4 cannot be selected when data is written or read.

On the other hand, in the semiconductor memory device and the method of manufacturing the same according to the present embodiment, since the dot-type charge accumulation portions 17 do not exist in the select transistor ST, the above-described problems do not occur, and when a predetermined voltage is applied, the select transistor ST is turned on. Further, the dot-type charge accumulation portions 17 do not exist in the peripheral transistors forming the row decoder 3 and the voltage generation circuit 2. Thereby, the same advantageous effects can be obtained from the peripheral circuits too.

In the above-described embodiment, the descriptions have been given with reference to the NAND type, but the semiconductor memory device may be a NOR type as well.

Moreover, the ratio of the density of the dot-type charge accumulation portions 17 arranged in region A3 and the density of the dot-type charge accumulation portions 17 arranged in regions A1, A2 may be different from the above-described one, as long as the density of regions A1 and A2 are higher than the density of region A3. Further, the density may take distribution suitable for characteristics of the memory cell transistor MT.

The above-described embodiment is not the only embodiment according to the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device, comprising:
a first insulation film located on an active area (AA);
a plurality of charge accumulation portions comprising minute crystals arranged on the first insulation film, a density of the charge accumulation portions at an end portion in an AA width direction of the first insulation film being higher than a density of the charge accumulation portions at a central potion in the AA width direction;
a second insulation film located on the first insulation film so as to coat the charge accumulation portions; and
a control gate located on the second insulation film.

2. The device according to claim 1, further comprising another active area, wherein an element separation region is located between the active areas,
the control gate is located on the second insulation film so as to straddle over the active areas, and
a density of the charge accumulation portions located at an end portion of the first insulation film in a direction in which the control gate straddles over the active areas is higher than a density of the charge accumulation portions at the center in said direction.

3. The device according to claim 1, wherein the minute crystals comprise a material including silicon or metal.

4. The device according to claim 1, further comprising:
a first select transistor including a third insulation film located on the active area, a fourth insulation film located on the third insulation film, and a gate electrode located on the fourth insulation film.

5. The device according to claim 4, further comprising:
a second select transistor including the third insulation film located on the active area, the fourth insulation film located on the third insulation film, and the gate electrode located on the fourth insulation film;
a plurality of memory cells each including the first insulation film, the charge accumulation portions, the second insulation film, the control gate, and a pair of impurity diffusion layers located in an upper portion of the active area so as to be separated from the control gate, wherein the plurality of memory cells are formed by arranging the impurity diffusion layers in series between the first select transistor and the second select transistor.

6. The device according to claim 1, wherein the active area is formed along a first direction,
the control gate is located so as to straddle over the active area along a second direction crossing the first direction,
the charge accumulation portions are located in a region in which the active area and the control gate cross, and
a distribution of a density of the charge accumulation portions in the region holds for any cross-section cut along the second direction in the region.

7. The device according to claim 1, wherein the charge accumulation portions are located on the first insulation film in a single layer.

8. The device according to claim 1, further comprising:
a voltage generation circuit which generates a voltage; and
a row decoder which applies the voltage to the control gate, wherein
the voltage applied by the row decoder to the control gate allows a saturated current to flow through the active area.

9. The device according to claim 1, wherein the charge accumulation portions have a diameter of 1-3 nm.

10. A semiconductor memory device, comprising:
an active area located along a first direction; and
a first word line located along a second direction crossing the first direction, wherein
a first memory cell is located in a first region in which the active area and the first word line cross,
the first memory cell includes:
a first insulation film located on the active area;
a plurality of charge accumulation portions comprising minute crystals arranged on the first insulation film;
a second insulation film located on the first insulation film so as to coat the charge accumulation portions; and
a first control gate located on the second insulation film, and
a density of the charge accumulation portions at end portions in the second direction of the first insulation film is higher than a density of the charge accumulation portions at a central portion of the second direction.

11. The device according to claim 10, further comprising another active area, wherein element separation region is located between active areas, and
a density of the charge accumulation portions located at an end portion of the first insulation film in the second direction is higher than a density of the charge accumulation portions at the center of the second direction.

12. The device according to claim 10, wherein the minute crystals comprise a material including silicon or metal.

13. The device according to claim 10, further comprising a first signal line located so as to straddle over the active area along the second direction, wherein
a first select transistor is located in a second region in which the first signal line and the active area cross, and
the first select transistor includes:
a third insulation film located on the active area;
a fourth insulation film located on the third insulation film; and
a gate electrode located on the fourth insulation film.

14. The device according to claim 13, comprising:
a second word line located adjacent to the first word line so as to straddle over the active area along the second direction; and
a second signal line located along the second direction such that the first signal line and the second signal line sandwich the first word line and the second word line, wherein a second memory cell is located in a third region in which the active area and the second word line cross, the second memory cell includes:
- a fifth insulation film located on the active area;
- the charge accumulation portions comprising minute crystals arranged on the fifth insulation film;
- a sixth insulation film located on the fifth insulation film so as to coat the charge accumulation portions; and
- a second gate electrode located on the sixth insulation film, a second select transistor is located in a fourth region in which the active area and the second signal line cross, and
the second select transistor includes:
- a seventh insulation film located on the active area;
- an eighth insulation film located on the seventh insulation film; and
- a second gate electrode located on the eighth insulation film.

15. The device according to claim 10, wherein the distribution of the density of the charge accumulation portions in the first region holds for any cross-section cut along the second direction in the first region.

16. The device according to claim 10, wherein the charge accumulation portions are located on the first insulation film in a single layer.

17. The device according to claim 14, further comprising:
a voltage generation circuit which generates a voltage; and
a row decoder which transfers the voltage to the first word line and the third word line, wherein
the voltage transferred by the row decoder to the first word line and the third word line allows a saturated current to flow in the active area of each of the first memory cell and the second memory cell.

18. A method of manufacturing a semiconductor memory device, comprising:
forming a first gate insulation film on a semiconductor substrate;
arranging a plurality of minute crystals at a predetermined density on the first gate insulation film;
removing only minute crystals arranged at a central portion in an active area (AA) width direction in a region in which an active area is to be formed on the first gate insulation film;
arranging the minute crystals at a predetermined density again on the first gate insulation film;
sequentially forming a first insulation film and a first conductive film on the first gate insulation film so as to coat the plurality of minute crystals;
forming an active area by patterning the first conductive film, the first insulation film, the first gate insulation film, and the semiconductor substrate;
forming a first element separation region by embedding an element separation insulation film;
forming a first gate electrode layer on the element separation insulation film and the first conductive film; and
forming a gate electrode by patterning the first gate electrode layer, the first conductive layer, the first insulation layer, and the first gate insulation film.

19. The method according to claim 18, further comprising:
forming a second gate insulation film on the semiconductor substrate;
arranging the plurality of minute crystals at a predetermined density on the second gate insulation film;
removing the minute crystals arranged on the second gate insulation film;
removing the minute crystals after arranging the minute crystals at a predetermined density again on the second gate insulation film;
sequentially forming a second insulation film and a second conductive film on the second gate insulation film;
forming an active area by patterning the second conductive film, the second insulation film, the second gate insulation film, and the semiconductor substrate;
forming an element separation region by embedding an element separation insulation film;
forming a second gate electrode layer on the element separation insulation film and the second conductive film; and
forming a gate electrode by patterning the second gate electrode layer, the second conductive layer, the second insulation film, and the second gate insulation film.

20. The method according to claim 18, wherein the minute crystals are formed using a material including silicon or metal.

* * * * *